United States Patent [19]

Müller

[11] Patent Number: 4,635,224
[45] Date of Patent: Jan. 6, 1987

[54] PROCESS AND SYSTEM FOR TRANSMITTING A REFRESH SIGNAL TO A SEMICONDUCTOR MEMORY

[76] Inventor: Otto Müller, Am Guckenbühl 10, D-7750 Constance 16, Fed. Rep. of Germany

[21] Appl. No.: 834,145

[22] Filed: Feb. 25, 1986

Related U.S. Application Data

[63] Continuation of Ser. No. 412,304, Aug. 27, 1982, abandoned.

[30] Foreign Application Priority Data

Aug. 27, 1981 [DE] Fed. Rep. of Germany ....... 3133838

[51] Int. Cl.⁴ .......................... G06F 9/46; G11C 7/00
[52] U.S. Cl. .................................. 364/900; 365/222
[58] Field of Search ... 364/200 MS File, 900 MS File; 365/222

[56] References Cited

U.S. PATENT DOCUMENTS 4,106,108  8/1978  Cislaghi et al. ..................... 365/222
4,133,051  1/1979  Gentili ................................. 365/222
4,339,808  7/1982  North ................................... 364/900

Primary Examiner—Eddie P. Chan
Attorney, Agent, or Firm—Boniard I. Brown

[57] ABSTRACT

A method and system are provided for the transmission of a refresh signal to a semiconductor memory connected with a central computer bus with predetermined transmission priority, the refresh signal and a refresh repeat signal which determines the chronological transmission of the refresh signal, being transmitted to the memory by a central processing unit at a predetermined priority in relation to other aggregates connected to the computer bus. According to the invention, the refresh repeat signal is split into at least two chronologically successive signals during the first component signal, and the refresh signal is transmitted to the computer bus during transmission of the first component at low priority, transmission of the refresh signal not being possible during the first component, and the refresh signal being placed on the computer bus on a higher priority during the second component signal.

3 Claims, 6 Drawing Figures

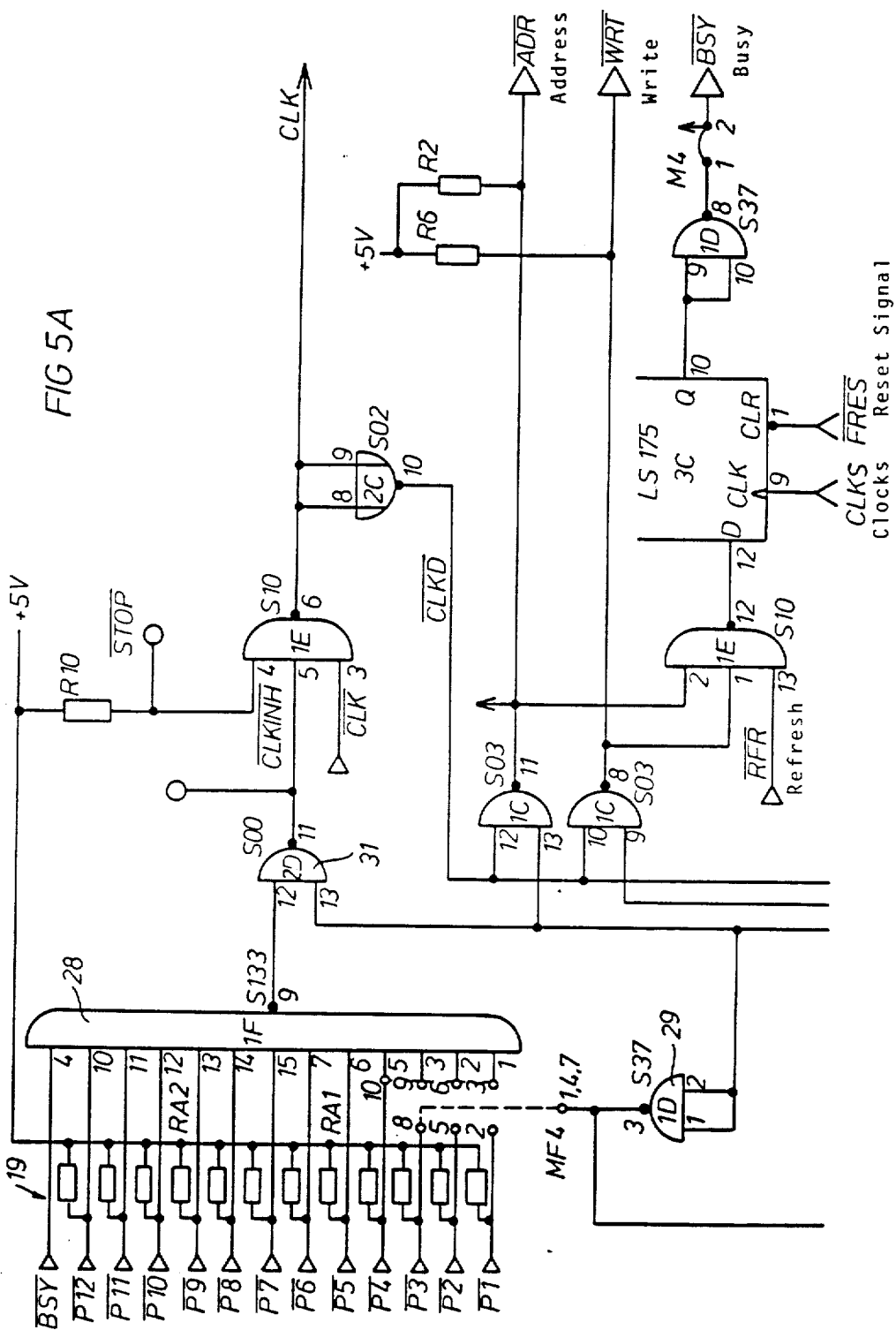

PROCESS AND SYSTEM FOR TRANSMITTING A REFRESH SIGNAL TO A SEMICONDUCTOR MEMORY

This is a continuation of co-pending application Ser. No. 412,304 filed on Aug. 27, 1982, now abandoned.

BACKGROUND OF THE INVENTION

The invention concerns a process to transmit the refresh signal to a semiconductor memory that is connected to a central computer bus with a certain transmission priority, where the refresh signal and a refresh repeat signal that determines the chronological transmission of the refresh signal are generated by a central processing unit (CPU) and can be transmitted to the semiconductor memory via the central computer bus at a certain priority with respect to other aggregates that are connected to the computer bus.

An initially cited process and a circuit for this purpose are used for digital computer systems. With semiconductor memories used in these computer systems a refresh signal must be transmitted to the semiconductor memory in precisely defined cycles (refresh repeat cycles) to prevent it from losing its information. According to the specifications of a semiconductor memory it may be required, for example, that a refresh repeat signal be generated 128 times in a span of 2 milliseconds. This refresh repeat signal will then have a duration of about 15 microseconds.

In the chronological course of this refresh repeat signal at least one refresh signal of about 0.3 microsecond duration must occur, which is transmitted to the memory to prevent information contained in the memory from being lost. It does not matter in what region within the course the refresh repeat signal the refresh signal is transmitted to the semiconductor memory. What is important is that at least one refresh signal is transmitted to the semiconductor memory within one refresh repeat signal. The refresh signal, which leaves the CPU and is placed on the semiconductor memory via the computer bus, immediately starts a refresh cycle in the semiconductor memory which consists of a complex sequence of different signals.

In a first known embodiment the refresh signal is generated internally in the semiconductor memory, which naturally results in complicated circuitry and difficulties with synchronization between other aggregates of the computer and this semiconductor memory.

In another known embodiment the refresh repeat signal and the refresh signal which occurs in the course of the refresh repeat signal are generated by the central processing unit (CPU) and these are transmitted via the central computer bus to the semiconductor memory which is also connected to the computer bus. But there are other aggregates attached to the computer bus which want to transmit their data to the storage units or the CPU via the computer bus in accordance with their preceding controllers. This therefore creates priority and transmission problems (collisions) with computer bus access, if the CPU wants to transmit its refresh signal to the memory while the external units also want to transmit their data over the computer bus.

As a rule the CPU is assigned the lowest priority and the controllers, which switch disk or tape data onto the computer bus, are assigned the highest priority. No data processing takes place in the CPU such that, during processing and transmission over the computer bus, data are irretrievably lost, while this is the case with the transmission from magnetic tape or disk data onto the computer bus, unless the cited aggregates have the highest priority.

The problem arises what priority to assign the semiconductor memories connected to the computer bus, in order to avoid collisions with higher priority controllers of external mass storage units.

To date the procedure has been to assign the semiconductor memory the highest priority in the data bus, so that this semiconductor memory will perform its refresh cycle in any case, which naturally had the disadvantage that while the refresh signal was on the computer bus the external mass storage units were unable to transmit their signals over the computer bus, resulting in difficulties with data transmission or even data loss.

The invention has made it its task to develop a process for the transmission of the refresh signal onto the computer bus and a corresponding circuit in such a way that the external mass storage units can be assigned a higher priority than the refresh signal, which is generated by the CPU and is transmitted to the semiconductor memory via the computer bus. It is therefore the purpose of the present invention to improve the data flow of external mass storage units over the computer bus without interrupting this data flow with an intervening refresh signal.

To solve the posed problem the invention is characterized in that the refresh repeat signal is split into one or more chronologically successive component signals and that the transmission of the refresh signal onto the computer bus takes place at a low priority during the duration of the first component signal and that, in case transmission of the refresh signal is not possible during the duration of the first component signal, the refresh signal is assigned a higher priority and is placed on the computer bus with a higher priority during the course of another component signal which occurs chronologically after the first component signal.

An essential characteristic of the present invention, therefore, is a chronologically differentiated priority control of the refresh signal.

In a first sequence phase (occurrence of the first component signal) the refresh signal is assigned a relatively low priority, and it is attempted to place the refresh signal onto the computer bus with this low priority. If the computer bus happens to be free during the course of the first component signal, transmission of the refresh signal from the CPU to the semiconductor memory succeeds and the problem is solved, since, if free time is found on the computer bus then the external mass storage units are not transmitting data on the computer bus and there will be no collisions between the external mass storage units and the CPU which wants to transmit its refresh signal to the semiconductor memory. But if no "window" (i.e. a chronological gap) is found for the CPU to transmit its refresh signal to the semiconductor memory during the course of the first component signal, time becomes pressing, since one refresh signal must definitely be transmitted over the computer bus to the semiconductor memory within one refresh repeat signal. If during the course of the first component signal, therefore, no such free window was found, one must create such a window during the course of the other component signal which follows chronologically after the first component signal, in order to provide the semiconductor memory with its refresh signal.

One could give the CPU the highest priority of all aggregates connected to the computer bus for transmission of the refresh signal. This would offer the advantage that during the course of the second component signal (i.e. during the remainder of the course of the refresh repeat signal) the refresh signal would be certain to be transmitted to the semiconductor memory via the computer bus.

But the disadvantage is that the controllers of the external mass storage units will have problems with their data transmission over the computer bus, which applies particularly to disk storage, because of its high data density.

SUMMARY OF THE INVENTION

According to the invention, therefore, the refresh signal may preferably not be allocated the highest of all priorities that occur, but a lower priority which is in any case lower than the priority of the external mass storage units, but higher than the priority of other aggregates that are connected to the computer bus.

Of course, it is not necessarily prescribed that the refresh repeat signal be split into two chronologically successive component signals, each of which is of the same length. This is only done for circuit-technological reasons, because division into two equal signal components is circuit-technologically easy to accomplish. It is equally within the scope of the present invention to choose a division of one third to two thirds of the length of the refresh repeat signal, so that placement of the refresh signal onto the computer bus at low priority is attempted during the first third of the refresh repeat signal, and, if no free window is found, the refresh signal is placed onto the computer bus at high priority during the the remaining two thirds of the refresh repeat signal.

A circuit operating according to the process first provides for the clock frequency derived from a stable quartz oscillator being divided by means of appropriate counter levels, such that a control signal with one alternation per refresh repeat signal is obtained. This control signal is first placed onto the computer bus with low priority. This low priority computer bus transmission is accomplished by applying the control signal to the input of an AND-gate to whose two other inputs are applied the signal which indicates the address line to be free and the signal which indicates the bus to be free. Only when all signals have the same logical state does the AND-gate conduct and transmit a refresh signal to the semiconductor memory, so that the semiconductor memory immediately generates a refresh cycle on the basis of this refresh signal.

If such a refresh signal was generated during the first duration of the refresh repeat signal, the flip-flops of this control circuit are reset and no new refresh signal can be generated during the course of the remaining period of the refresh repeat signal.

But if no appropriate refresh signal could be generated during the course of the first component signal (beginning of the refresh repeat signal), then the corresponding flip-flops of the control circuit have not been reset and the control circuit is still functioning. According to the invention the logical state of the control circuit then changes and the control signal is directly applied to a priority control unit, avoiding the above mentioned control circuit, where the refresh signal is assigned the third or fourth highest priority of all priorities occurring in the computer system. Tests and the applicant's experience have shown that assignment of this priority is sufficient for finding a free window in the computer bus during this period of time in order to transmit the refresh signal to the semiconductor memory over this computer bus.

The subject matter of the present invention arises not only out of the subject matter of the individual patent claims, but also from the mutual combination of the individual patent claims.

All data and characteristics disclosed in the documents, particularly the spatial configuration represented in the drawings, are claimed as being essential to the invention, insofar as they are new with respect to the state of the art, individually or in combination.

The invention is explained in some detail below, using a drawing which merely illustrates one embodiment. The drawing and description reveal further features that are essential to the invention as well as merits of the invention.

BRIEF DESCRIPTION OF THE DRAWINGS

FIGS. 5A and 5B show the circuit for priority control of the two component signals derived from the refresh repeat signal.

DESCRIPTION OF THE PREFERRED EMBODIMENT

Regarding the technical designation of the designations used in the circuit diagrams, note that the designations LS109 or S37 or LS02, for example, designate Texas Instruments components and that these are type designations used by that company.

Figure 1:
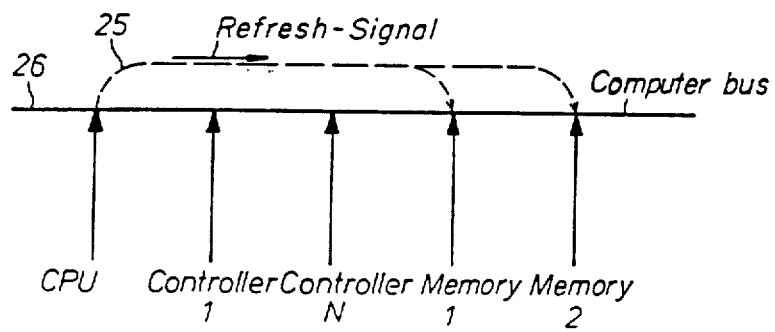
FIG. 1 shows the schematic connection of various aggregates to the computer bus.

FIG. 1 illustrates schematically that different aggregates of the computer system are connected to the computer bus. These are, for example, the CPU, various controllers of external units such as disk drive, tape drive, screen, printer, etc. Also connected to the computer bus are different semiconductor memory units (memory 1, memory 2). Also illustrated schematically is that the CPU generates a refresh signal 25 at the specified time, which is applied to memories 1 and 2 via the computer bus 26.

Figure 2:
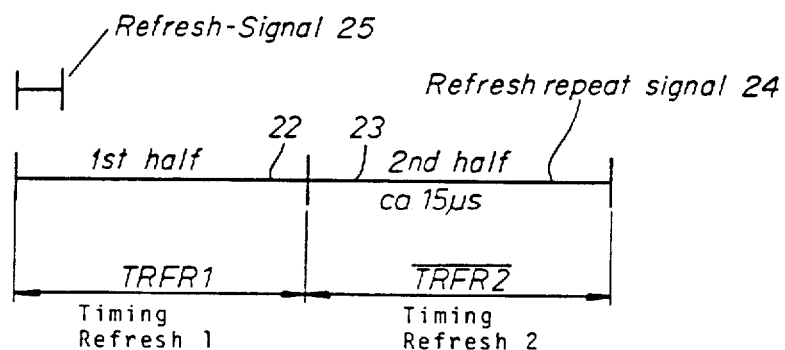
FIG. 2 shows the chronological sequence of the refresh signal and of the refresh repeat signal.

FIG. 2 shows that the refresh signal 25 must occur in the region (during the chronological course) of the refresh repeat signal 24. The refresh repeat signal has a duration of 15 microseconds, while the refresh signal 25 has a duration of about 0.3 microseconds. According to the invention the refresh repeat signal 24 is divided into two component signals 22, 23; the first component signal, which occurs first chronologically, bears the designation TRFR1, while the second component signal 23, which occurs after the first component signal 22, bears the designation $\overline{\text{TRFR2}}$.

The division into two component signals of equal length 22, 23 is arbitrary and is only preferred for circuit-technological reasons, because it is relatively simple, in circuit-technological terms, to divide the refresh repeat signal 24 into two equal component signals 22, 23. In other systems and processes, different ratios of division, e.g. TRFR1-$\overline{\text{TRFR2}}$ as 1:3 or 2:3 may be used.

Figure 3:
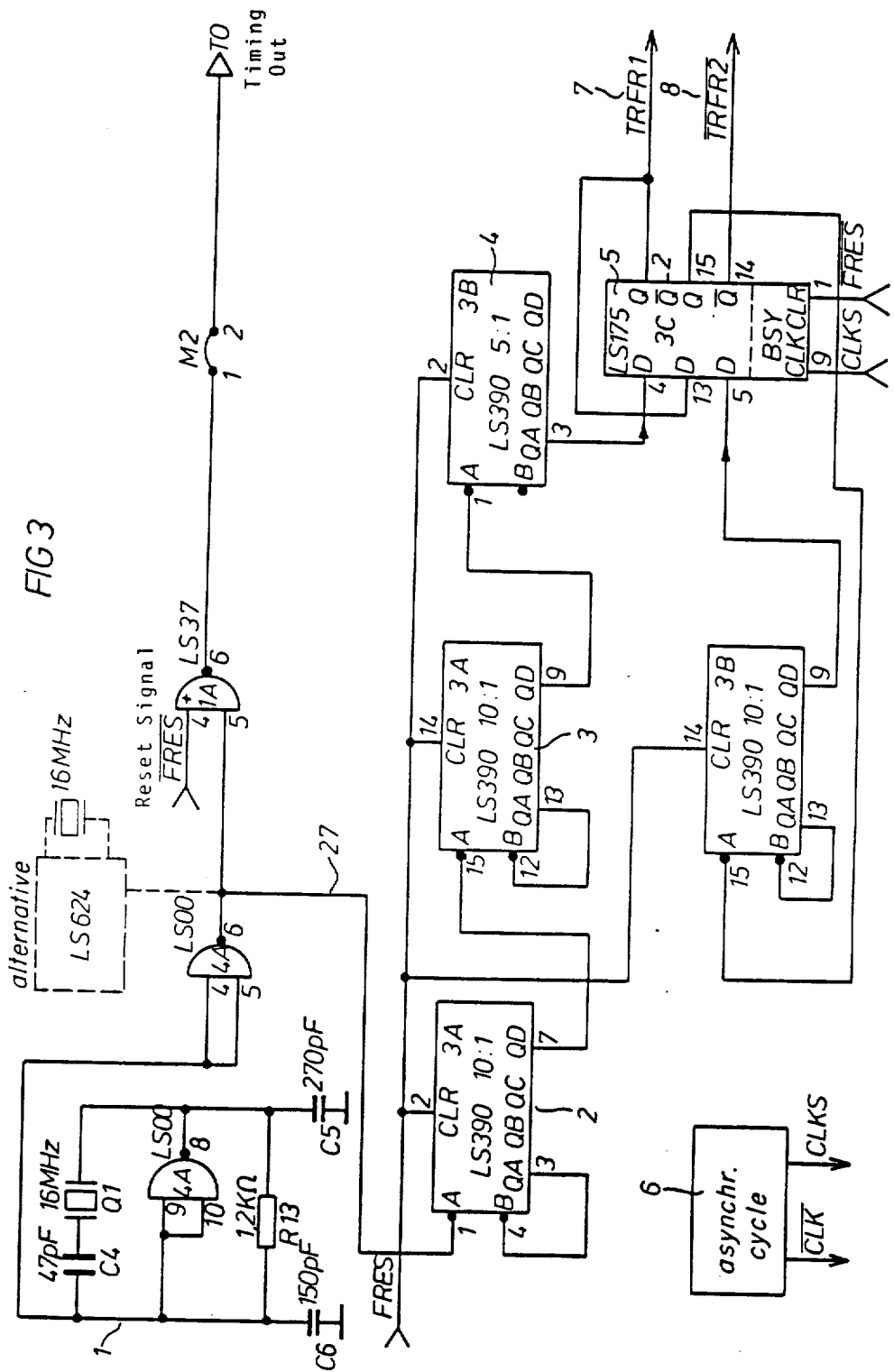
FIG. 3 shows the circuit for generating the refresh repeat signal.

FIG. 3 shows a circuit for generating the two component signals TRFR1 and $\overline{\text{TRFR2}}$ from one refresh repeat signal 24.

Using a quartz-stabilized clock generator 1, a clock cycle is generated which is applied to the input 1 of a divider circuit 2, 3, 4 via the line 27. The resulting clock rate is applied to the D-input of a flip-flop 5, where the synchronous quartz cycle is synchronized into an asynchronous computer cycle. An asynchronous clock circuit 6 is provided for this purpose, which generates an asynchronous computer clock cycle, namely corresponding to the duration of a memory cycle. This asynchronous computer cycle is then fed into input 9 via the CLKS line. At the output 2 of the flip-flop 5 the first component signal TRFR1 of the refresh repeat signal 24 is present on line 7. The second component signal 23 is present at output 14 on line 8 of the flip-flop 5 and bears the designation $\overline{\text{TRFR}}$. The flip-flop 5 is a D flip-flop, i.e. with each successive cycle the output assumes the input state. The output thus mirrors the status of the input with a time delay of one clock cycle.

Figure 4:
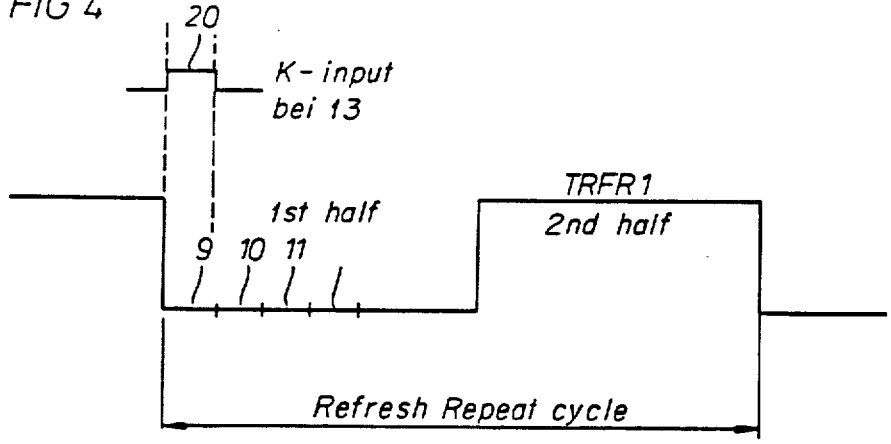
FIG. 4 shows the chronological sequence and the logical state of the component signal derived from the refresh repeat signal.

FIG. 4 illustrates such an output signal TRFR1. During the duration of the refresh repeat signal the signal TRFR1 changes from digital 0 to digital 1. During the first half of the TRFR1 signal a series of cycles 9, 10, 11, etc. take place. The control circuit 12 shown in FIG. 5 screens out a cycle 20 (i.e. the refresh signal 25) during the refresh repeat cycle. For practical reasons the leading edge of the TRFR1 signal is chosen for this purpose; but any other edge or any other arbitrary point in the course of the refresh repeat signal can be chosen.

Figure 5B:
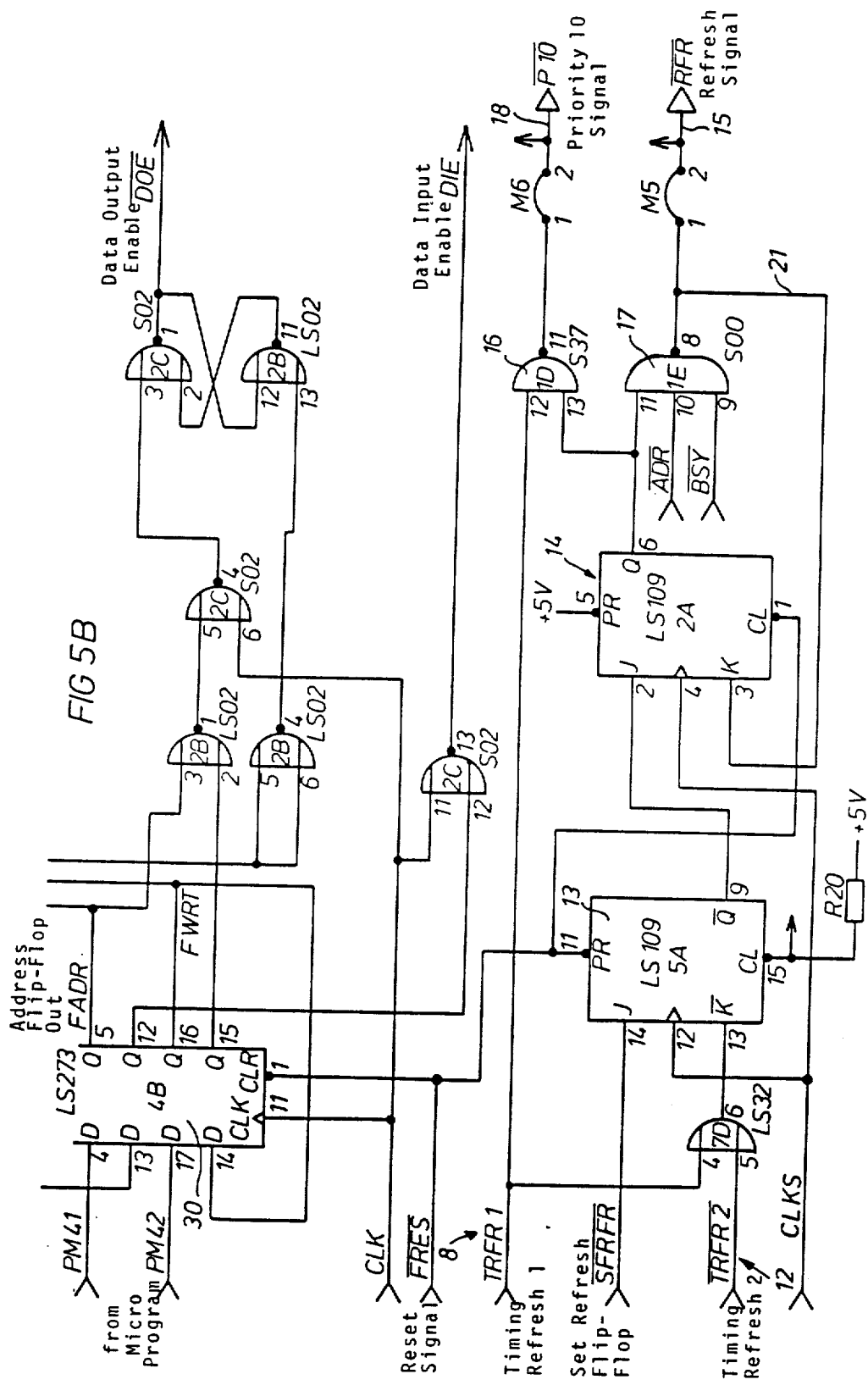

With the arrival of the first half of the TRFR1 signal, together with the cycle 20, the flip-flop 13 in FIG. 5 is set to logical 1. The input 13 (K-input) thus remembers that during the refresh repeat cycle a request for transmission of a refresh signal 25 occurs. With the switching of this flip-flop 13, the subsequent flip-flop is also activated one cycle later. The cycle is provided via the CLKS line.

After this flip-flop 14 has been set to a logical 1 a refresh signal $\overline{\text{RFR}}$ is output on the output line 15, if the computer bus 26 is free. The free availability of the computer bus 26 results from the fact that the refresh signal $\overline{\text{RFR}}$ at the output 6 of the flip-flop 14 is placed on the input 11 of an AND-gate 17, while the signals $\overline{\text{BSY}}$ and $\overline{\text{ADR}}$ are placed onto inputs 9 and 10. $\overline{\text{ADR}}$ is the signal to transmit the address on the computer bus and has the logical value 1 when the computer bus is free. The computer bus is free when the $\overline{\text{BSY}}$ signal is also at logical 1.

Only when all three of the named signals are at logical 1 will the refresh signal $\overline{\text{RFR}}$ be placed on the computer bus on line 15 and transmitted to the semiconductor memory, which immediately generates a refresh cycle. After output of a refresh signal $\overline{\text{RFR}}$ the flip-flop 14 is reset via line 21, so that a refresh signal can only be output once during the course of a refresh repeat cycle.

If it was impossible to output a refresh signal on line 15 during the first half (logical 0 of the TRFR1 signal), then the flip-flop 14 has not been reset and it remains in its state. Now a refresh signal of higher priority must be sent over the computer bus, so that the semiconductor memory will certainly receive its refresh signal during the remaining duration of the refresh repeat signal.

A higher priority is assigned in the following manner:

During the second half the TRFR1 signal is logical 1, in accordance with FIG. 4. This signal is directly placed on the AND-gate 16, to whose other input 13 the output 6 of the flip-flop 14 is connected, which is still engaged because no reset signal has yet arrived over line 21. The $\overline{\text{TRFR2}}$ signal at the output 14 of the flip-flop 5 is also logical 1. This generates a signal $\overline{\text{P10}}$ on the output line 18 of the AND-gate 16, regardless of whether the address line is free or whether the computer bus 26 is busy.

This signal $\overline{\text{P10}}$ is applied to a priority control unit 19 which determines the priorities of the various aggregates connected to the computer bus 26. The priority control unit 19 consists of an AND-gate 28, to whose inputs 13 various priority signals are applied. The signal $\overline{\text{P10}}$ is the priority signal for the refresh cycle while the $\overline{\text{BSY}}$ signal is the priority signal for the bus system (bus control).

When the bus system in in operation, it sets its own priority by setting a flip-flop with a cycle time delay, and this flip-flop generates the $\overline{\text{BSY}}$ signal, as illustrated in FIG. 5.

The inputs are also connected to resistors and to the positive supply voltage, to prevent an unstable state from resulting when an input is not applied.

By use of a plug MF4, priorities can be manually selected on the circuit board of the priority control unit 19. In the present embodiment the lower two inputs have a low priority and the third input acts as output for the lower priority inputs below it, because of its connection to the output of the AND-gate 29, i.e. depending where this connection line from the output 3 of the AND-gate 29, drawn as a broken line, is plugged on the circuit board, the inputs below it will be assigned lower priorities.

A flip-flop 30 is also provided which generates a FADR signal at its output, and this flip-flop controls the priority gate (AND-gate 29, which generates the respective priority signal at its output 3).

The priority signal at the output of gate 29 is only produced and generated when the respective aggregate wants to transmit on the computer bus and when one must check the priority of this aggregate and whether it can and may be switched onto the computer bus.

At this time the computer logs on the priority signal via this flip-flop 9 and the inputs PM4 1 and PM4 2. The signal PM4 2 means write, FWRT generally, the signal FADR stemming from bit 41 means priority request, and when neither writing nor this signal is generated it means a read request.

If a request to switch the aggregate onto the computer bus now arrives, e.g. from the CPU or one of the controllers for a peripheral unit via the line $\overline{\text{P10}}$ with the bit PM4 1, the signal FADR is generated by the flip-flop 9 and the gate 29 is connected and the respective input to which the gate output is connected is activated.

It is important in the cited priority control that when an aggregate has received its requested priority and may switch onto the computer bus, all other cycle signals for all other aggregates be turned off, so that these aggregates cannot direct a priority request signal to the priority control unit 19 during the busy cycle of the computer bus.

The priority control unit 19 may also be embodied in a different manner. It is important only that the priority signal $\overline{\text{P10}}$ has such a high priority that it will be switched onto the computer bus with the greatest probability, although its priority is lower than the priority for the computer bus itself ($\overline{\text{BSY}}$ signal) and below priorities $\overline{P12}$ and $\overline{P11}$, which may be assigned to external controllers of mass storage units, for example.

It is only essential in the present invention that during the first phase of the refresh repeat signal an attempt is made to find a window to the computer bus at a lower priority and that—if this is not successful—the refresh signal is pushed onto the computer bus at high priority during the remaining course of the refresh repeat signal. There is no need to choose the highest priority, because the two highest priorities are assigned to corresponding units which never require all of the "window time" when switched onto the computer bus during the duration of the "second window," so that time still remains to transmit the refresh signal.

The inventor claims:

1. A circuit arrangement for the transmission of a refresh signal to a semi-conductor memory which is connected to a central computer bus having a plurality of different aggregates attached thereto, each with a designated priority relative to the others, in which the refresh signal originates from a central processing unit (CPU) at a specific priority in comparison to other aggregates connected to the computer bus, to be delivered to a semi-conductor memory, in which the refresh signal is divided to at least two chronologically consecutive sub-intervals and the transmission of the refresh signal during the duration of the first sub-interval has a lower priority onto the computer bus and that, in the case of transmission of the refresh signal not being possible during the duration of the first sub-interval, the transmission of the refresh signal onto the computer bus is achieved at higher priority during the duration of the later sub-interval, characterized as: that the refresh signal (24) is divided into two sub-intervals (TRFR 1, TRFR2) by applying a clock cycle to an input of a divider circuit (2, 3, 4) an output of the divider circuit is applied to an input of a D-flip-flop (5) which outputs said two sub-intervals, and that during the duration of the first sub-interval (TRFR 1), a controller (13, 14, 17) generates the associated refresh signal $\overline{RFR}$ for the semi-conductor memory, said controller comprises a flip-flop (13) for receiving the two sub-intervals (TRFR 1 and $\overline{TRFR2}$) and for generating an output to an input of a further flip-flop 14, an output of said flip-flop 14 is connected to one input (input 11) of a NAND-gate (17), the other inputs of said NAND-gate (17) are connected to receive status signals (ADR, BSY) to indicate the transmission readiness of an address line and the computer bus are connected; and that during the later sub-interval, the first sub-interval signal (TRFR 1) changes its logic status, the signal on said one input (input 11) of the NAND-gate (17) and on the output of said flip-flop (14) is connected to the input (input 13) of a further NAND-gate (16) on whose other input (input 12) the first sub-interval signal (TRFR 1) is placed; and that the signal ($\overline{P10}$) generated on the output (output 11) of the further NAND-gate (16) is placed as a higher level priority signal via a priority controller (19) onto the computer bus, with a result that the lower priority aggregates are caused to release the address line and the computer bus (26).

2. Circuit arrangement according to claim 1 characterized as: that the priority assigned to the refresh signal (RFR) during the duration of the first sub-interval signal (TRFR 1) is one of the three lowest priorities of any aggregates connected to the bus.

3. Circuit arrangement according to claim 2 characterized as: that the higher priority assigned to the refresh signal (RFR) during the duration of the second sub-interval is lower than the priority assigned to any external mass storage units connected to the bus.

* * * * *